United States Patent [19]

Wu

[11] Patent Number: 5,756,388

[45] Date of Patent: May 26, 1998

[54] METHOD FOR FABRICATING A RAKE-SHAPED CAPACITOR

[75] Inventor: Shye-Lin Wu. Hsinchu Hsien, Taiwan

[73] Assignee: Powerchip Semiconductor Corp., Hsin-Chu, Taiwan

[21] Appl. No.: 881,776

[22] Filed: Jun. 24, 1997

[51] Int. Cl.$^6$ ................................................. H01L 21/20
[52] U.S. Cl. ........................ 438/397; 438/253; 438/255; 438/398; 148/DIG. 14
[58] Field of Search ............................ 438/253, 254, 438/255, 396, 397, 398; 148/DIG. 14

[56] References Cited

U.S. PATENT DOCUMENTS

| | | | |
|---|---|---|---|
| 5,464,791 | 11/1995 | Hirota | 438/253 |
| 5,480,824 | 1/1996 | Jun | 438/396 |
| 5,482,882 | 1/1996 | Lur et al. | 438/396 |
| 5,482,885 | 1/1996 | Lur et al. | 438/396 |
| 5,492,848 | 2/1996 | Lur et al. | 438/396 |
| 5,604,148 | 2/1997 | Lur | 438/254 |

*Primary Examiner*—Tuan H. Nguyen
*Attorney, Agent, or Firm*—Ladas & Parry

[57] ABSTRACT

A method for fabricating a capacitor on a semiconductor substrate is disclosed. The method includes forming successively, a TEOS layer, a first dielectric layer and an insulating layer over the semiconductor substrate. Then a window filled with a polysilicon plug through the three layers is formed. The insulating layer is patterned by an HSG-Si layer deposited thereon, thereby forming a polysilicon rod and a plurality of insulating rods. A conducting polysilicon layer is formed over the polysilicon rod and the plurality of insulating rods when the HSG-Si layer is removed. The first dielectric layer and the insulating rods are removed, thereby forming a rake-shaped electrode which includes the polysilicon rod and the conducting polysilicon layer. Moreover, a second dielectric layer and another electrode are formed over the rake-shaped electrode.

14 Claims, 6 Drawing Sheets

METHOD FOR FABRICATING A RAKE-SHAPED CAPACITOR

BACKGROUND OF THE INVENTION

1. Field of the Invention

The present invention relates to a method for fabricating a semiconductor integrated circuit, and more specifically, to a method for fabricating a highly-integrated rake-shaped capacitor for use in high density Dynamic Random Access Memory (DRAM) cells.

2. Description of Related Art

A DRAM cell consists of a transistor and a capacitor for storing one 1-bit of data. In order to improve the performance of the DRAM device, the surface area of the capacitor in each DRAM cell has a relatively large size. However, increasing the capacitor's dimensions reduces the density of the whole DRAM device. A highly integrated capacitor structure is therefore very desirable.

In the past, a stacked capacitor has been utilized in a DRAM cell. The stacked capacitor structure includes expanded electrodes to increase the surface area of the capacitor. FIG. 1A through FIG. 1C illustrate the fabrication steps used in making a conventional stacked DRAM capacitor. Referring to FIG. 1A, a transistor having a gate oxide layer 14, a gate electrode 16 and diffusion regions 18 and 20 is formed upon a silicon substrate 10. The transistor is isolated from other devices by a field oxide layer 12. In order to fabricate a capacitor, an insulating layer 22 is formed over the transistor and the field oxide 12 and is patterned to define a window 23 over the diffusion region 18. Thus, a portion of the diffusion region 18 is exposed in the window 23.

Referring to FIG. 1B, a conducting polysilicon layer 24 is deposited and patterned on the structure of FIG. 1A so that it overlays the window 23, thereby covering the exposed surface of the substrate 10 and electrically conducting contact with the diffusion region 18. The polysilicon layer 24 will become a lower electrode of the DRAM capacitor which is being formed.

Further referring to FIG. 1C, a dielectric layer 26 and another conducting polysilicon layer 28 are successively formed over the polysilicon layer 24. The polysilicon layers 24 and 28 are provided for the lower electrode and upper electrode, respectively, thus forming a complete stacked capacitor.

The lower electrode of the stacked capacitor of FIG. 1C extends over the dielectric layer 22 to enlarge its surface area. However, as the density of the DRAMs increases, the free spaces between each transistor must be minimized. The increase in density, in turn, requires that the extension of the lower electrode over the dielectric layer is limited, reducing the capacitance of the DRAM capacitor. As such, the capacitor's performance will be adversely affected as the density of the DRAM cells increases.

SUMMARY OF THE INVENTION

Accordingly, the invention provides a method for fabricating a rake-shaped capacitor which is highly-integrated while having a large capacitor surface area, thereby allowing highly compact, high performance DRAM device to be fabricated.

The invention provides a rake-shaped capacitor on a semiconductor substrate. The method of the invention includes the steps of forming a TEOS layer over the semiconductor substrate; forming a first dielectric layer over the TEOS layer; forming an insulating layer over the first dielectric layer; forming a window through the insulating layer, the first dielectric layer and the TEOS layer to expose a portion of the substrate; filling a conducting polysilicon plug in the window to contact the semiconductor substrate; forming an HSG-Si layer over the insulating layer; removing portions of the insulating layer which are uncovered by the HSG-Si layer, thereby forming a polysilicon rod and a plurality of insulating rods over the first dielectric layer; removing the HSG-Si layer; forming a conducting polysilicon layer over the polysilicon rod and the plurality of insulating rods; patterning a capacitor region which includes the polysilicon rod and a portion of the insulating rods; removing the first dielectric layer and the insulating rods, thereby forming a rake-shaped electrode which includes the polysilicon rod and the conducting polysilicon layer; forming a second dielectric layer over the exposed surface of the rake-shaped electrode; and forming another electrode over the second dielectric layer.

DETAILED DESCRIPTION OF THE INVENTION

The embodiment of the invention will be described in accompaniment with the drawings of FIG. 2A through FIG. 2J.

Figure 1A:
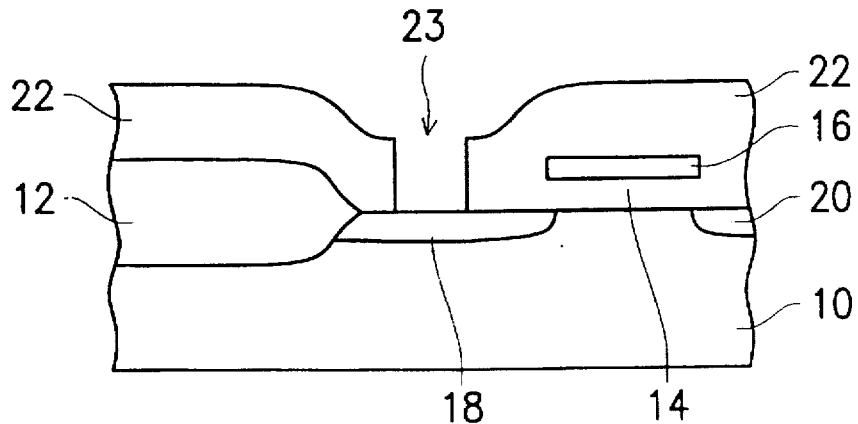
FIG. 1A through FIG. 1C are cross-sectional views illustrating the fabrication steps of a conventional stacked capacitor.
Figure 1B:
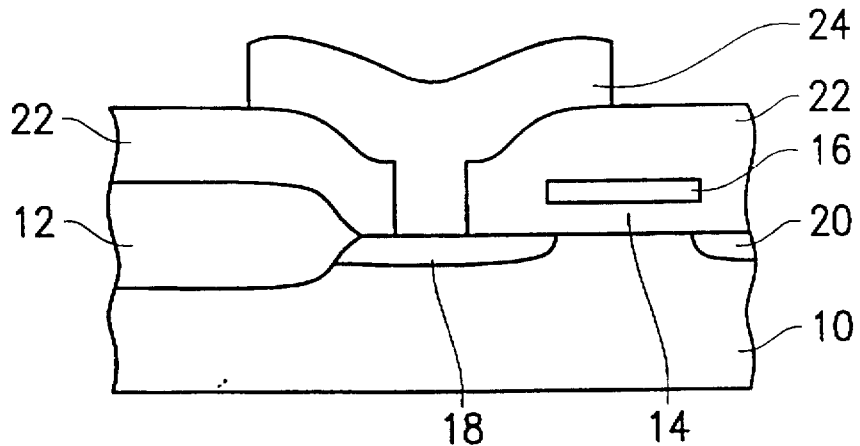
Figure 1C:
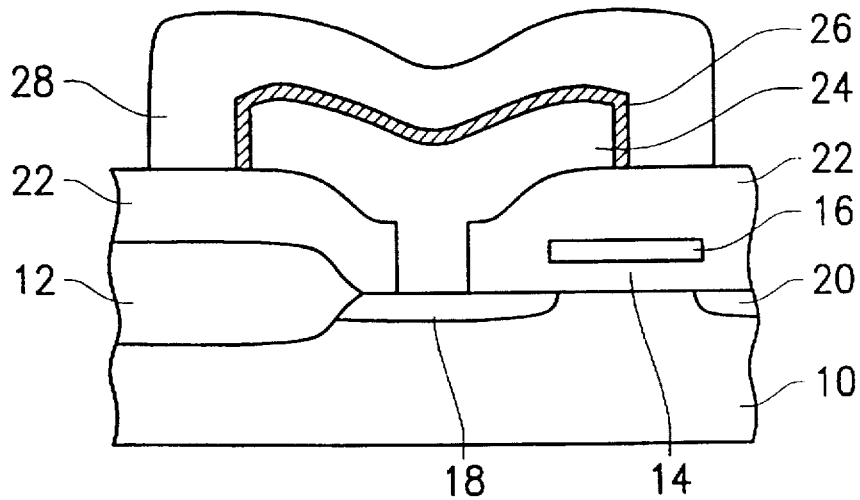
Figure 2A:
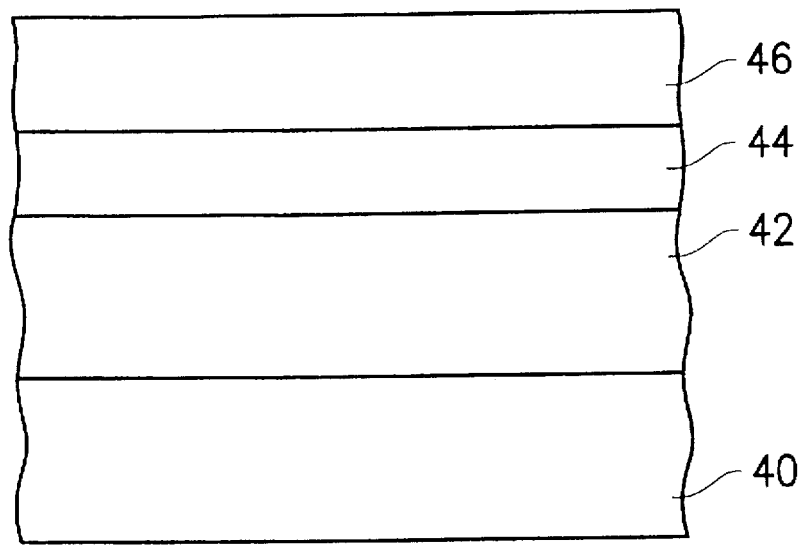
FIG. 2A through FIG. 2J are cross-sectional views illustrating the fabrication steps of a stacked capacitor according to an embodiment of the invention.

Referring to FIG. 2A, the capacitor of the invention is fabricated over a semiconductor substrate 40, which is a silicon substrate in the present embodiment. Then a tetra-ethyl orthosilicate (TEOS) layer 42, a first dielectric layer 44 and an insulating layer 46 are successively formed over the semiconductor substrate. The TEOS layer 42 is formed to a preferred thickness of about 2000–10000 Å. The first dielectric layer 44, which is preferably a silicon nitride ($Si_3N_4$) layer, is deposited over the TEOS layer to a thickness of, for example, 500–2000 Å. The insulating layer 46 is preferably a layer of borophosphosilicate glass (BPSG) in the embodiment and preferably has a thickness of about 2000–10000 Å.

Figure 2B:
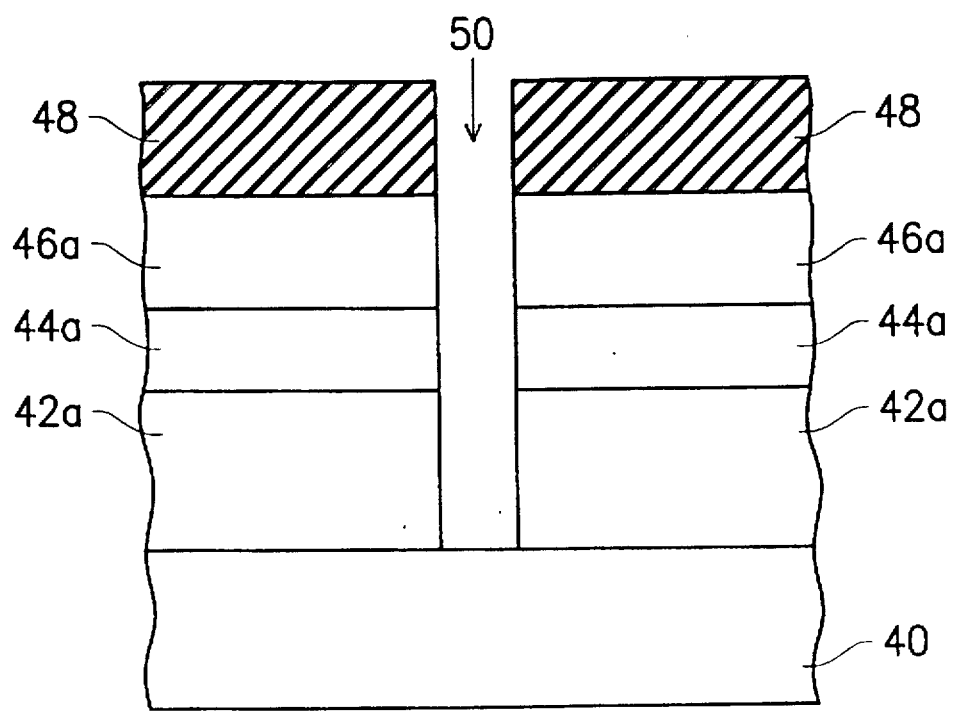

In order to define a contact hole, a photoresist layer 48 (FIG. 2B) is formed over the insulating layer 46. Referring now to FIG. 2B, a window 50 is provided by a contact hole formed through the insulating layer 46a, the first dielectric layer 44a and the TEOS layer 42a using the photoresist layer 48 as a mask. The window 50 is formed by dry etching techniques. After etching the contact hole, a portion of the semiconductor substrate 40 is exposed in the window 50.

Figure 2C:
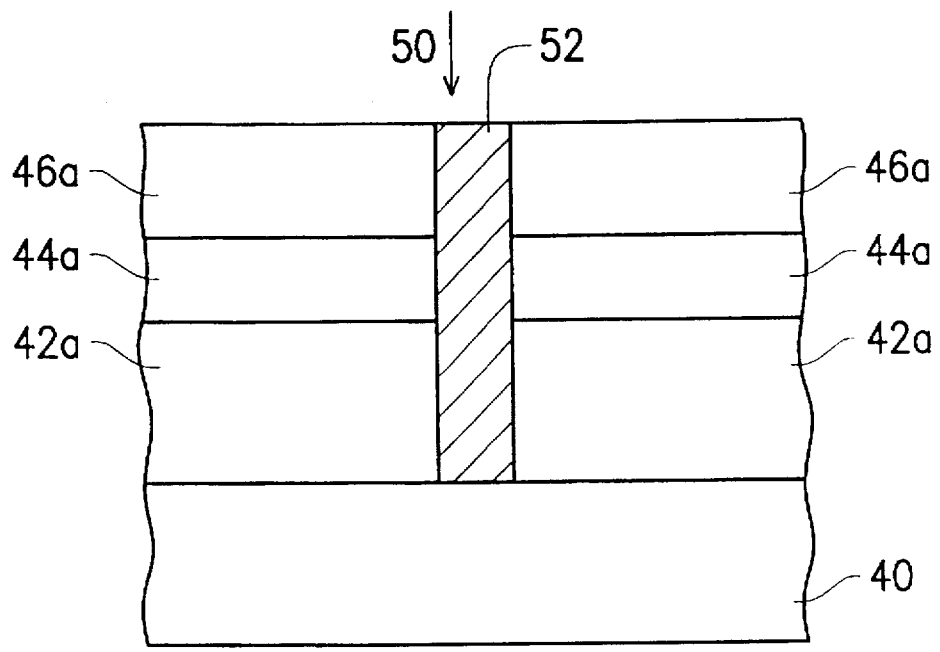

The photoresist layer 48 is then removed. Referring now to FIG. 2C, a conducting polysilicon plug 52 is filled in the window 50 making contact the exposed semiconductor substrate 40. The conducting polysilicon plug 52 can be formed by depositing a layer of doped polysilicon over the insulating layer 46a which fills in the window 50 using deposition methods such as chemical-vapor deposition (CVD). The layer is then etched back by dry etching techniques leaving the remaining polysilicon as plug 52.

Figure 2D:
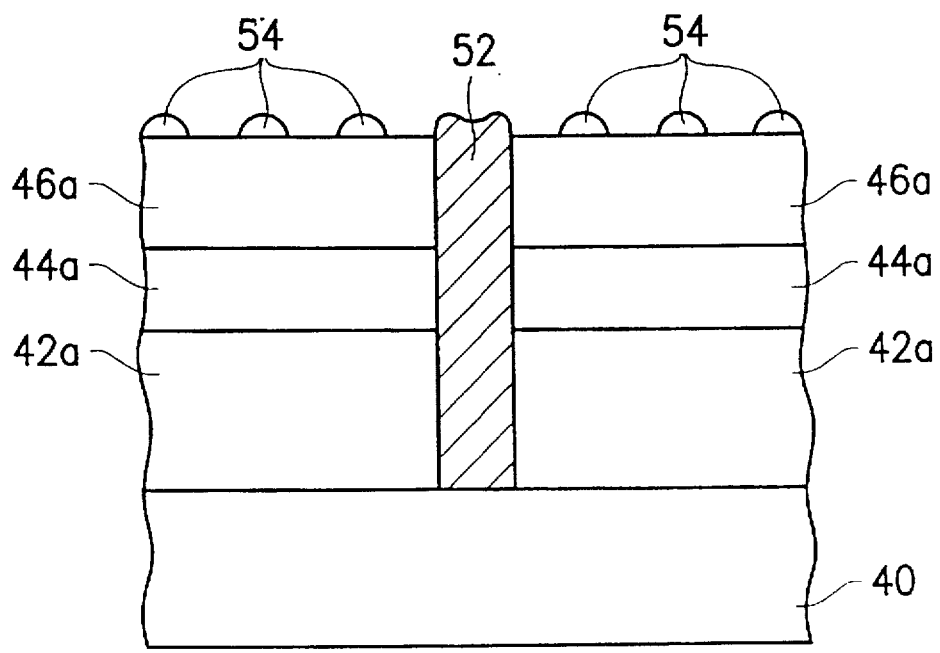

Referring to FIG. 2D, an hemispherical grained silicon (HSG-Si) layer 54 is formed over the insulating layer. The HSG-Si layer 54 can be an undoped silicon layer which is formed by, for example, (I) the low-pressure chemical-vapor deposition (LPCVD) method at the transition temperature from amorphous silicon to polysilicon, (ii) the ultra-high-vacuum annealing method of native-oxide free amorphous silicon, or (iii) preferably the seeding method. The seeding method includes steps of $Si_2H_6$ molecule irradiation and annealing at a certain temperature (for example, 550°–600° C.) in an ultra-high-vacuum (UHV) chamber. If the seeding method utilized, the grain size of the HSG-Si can be controlled by the UHV-annealing time after the $Si_2H_6$ molecule irradiation.

Figure 2E:
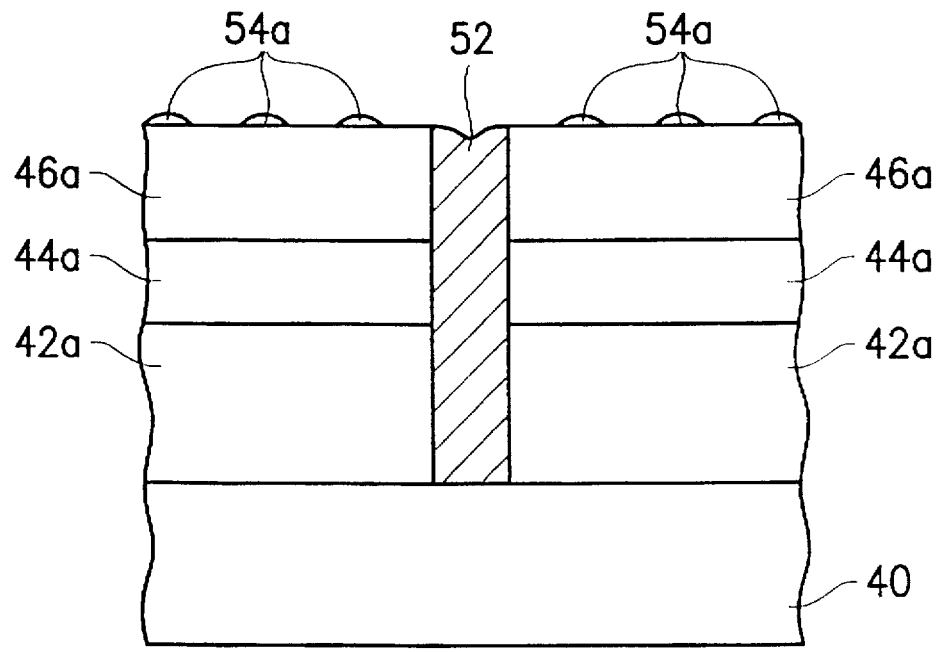
Figure 2F:
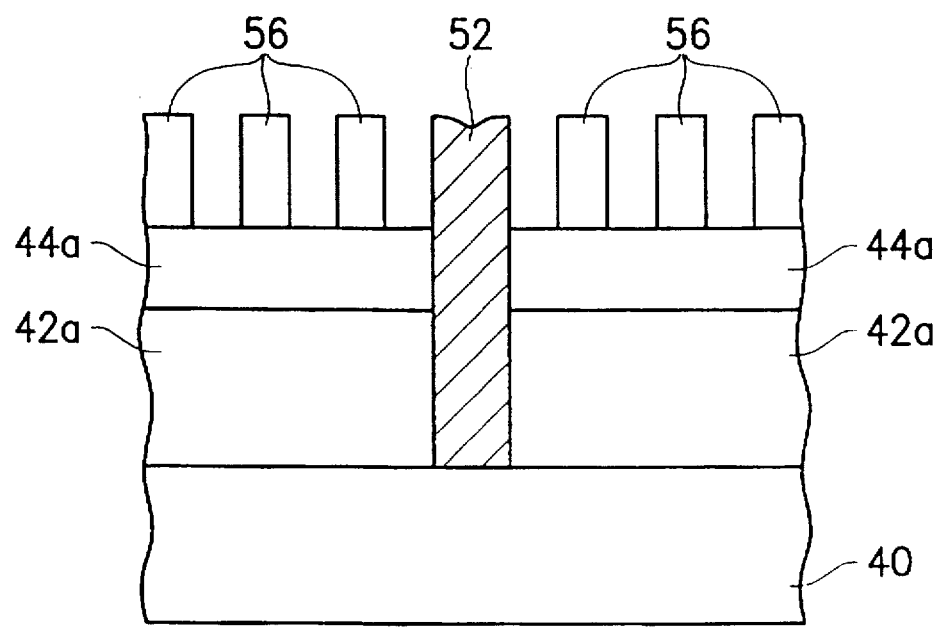

In the embodiment, larger HSG-Si grains are formed and then, optionally, slightly etched back, as shown in FIG. 2E. The optional etching back step of the HSG-Si layer can be carried out by means of the dry etch. Thereafter, the now smaller HSG-Si grains are utilized as masks for etching the insulating layer 46a, by dry etching techniques. Referring to FIG. 2F, portions of the insulating layer 46a which are exposed by the HSG-Si layer 54a are removed, thereby forming a polysilicon rod 52 and a plurality of insulating rods 56 over the first dielectric layer 44a. In the preferred embodiment, the insulating layer 46a is a BPSG layer, and, as such, it can be removed by $HF/H_2O$ vapor etching or other etching methods which have high selectivity between silicon, BPSG and silicon nitride materials.

Figure 2G:
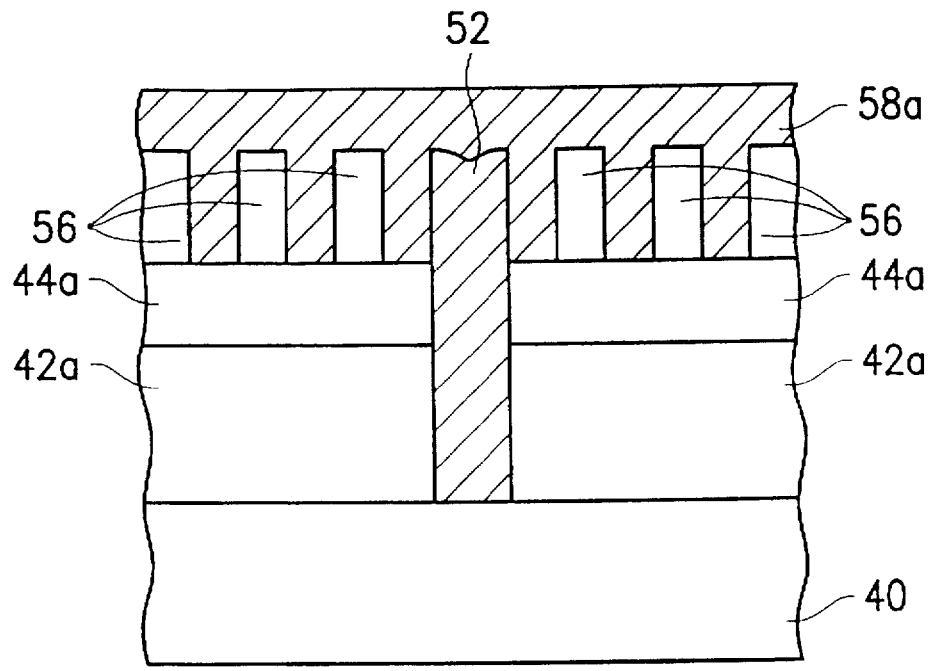
Figure 2H:
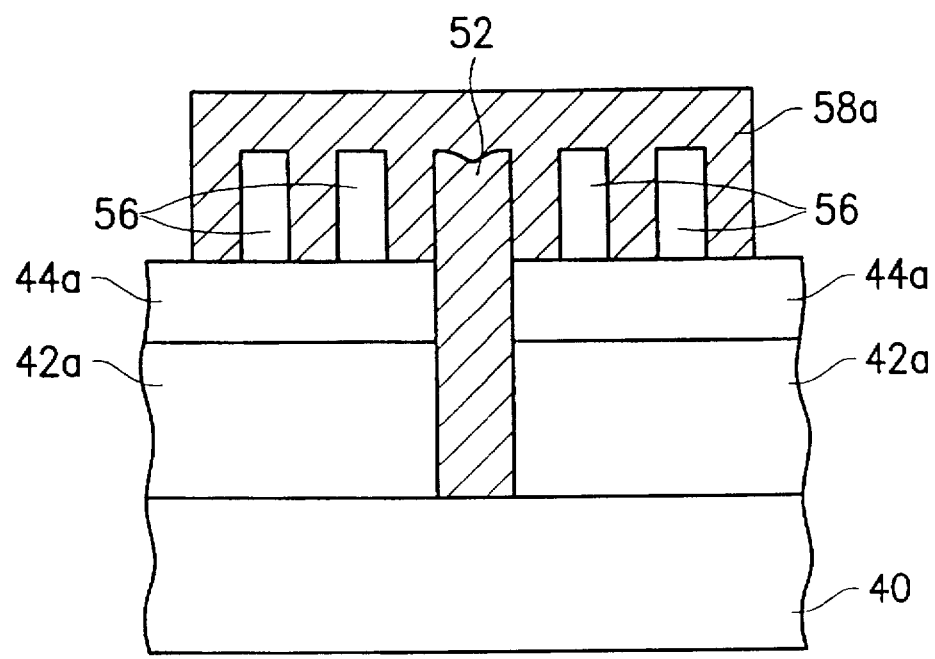

The HSG-Si layer 54a is then removed by means of etching solution, and a conducting polysilicon layer 58 is formed, by CVD method, over the polysilicon rod 52 and the plurality of insulating rods 56. The polysilicon layer's conductivity is improved by doping it with known impurities, which impurities can be added before or after the polysilicon layer 58 is deposited in place. Referring to FIG. 2G, the conducting polysilicon layer 58 covers all the insulating rods 56 and contacts to the first dielectric layer 44a. Referring to FIG. 2H, the polysilicon layer 58 is further patterned into a capacitor region, which is an island including the polysilicon rod 52 and a portion of the insulating rods 56 all surrounded by the polysilicon layer 58a.

Figure 2I:
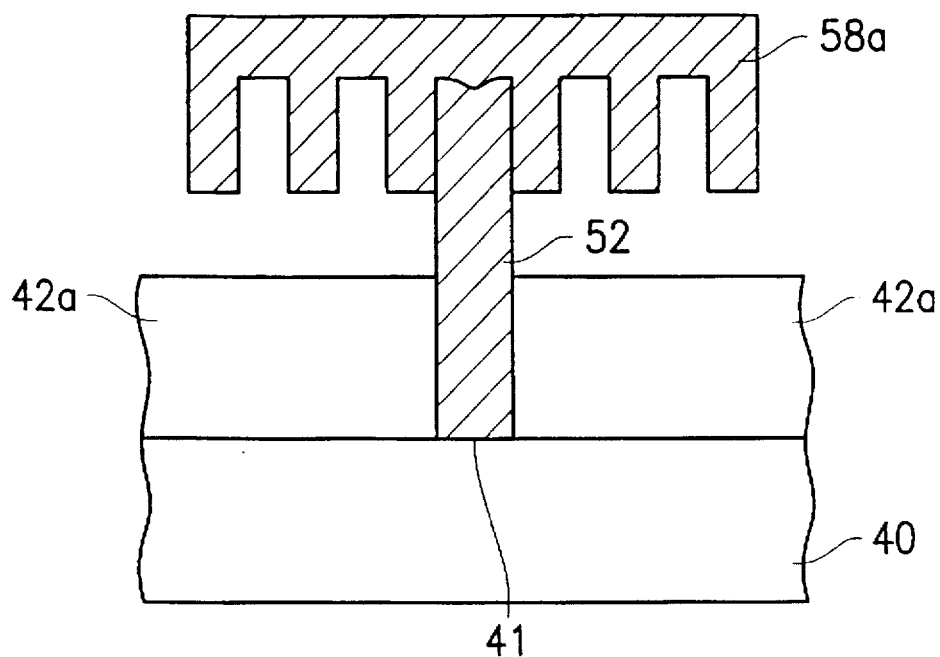

When the first dielectric layer 44a and the insulating rods 56 are removed by a selective etch, a rake-shaped electrode which includes the polysilicon rod 52 and the conducting polysilicon layer 58a is formed over the TEOS layer 42a, as shown in FIG. 2I. The first dielectric layer 44a, which is preferably a silicon nitride layer in this embodiment, can be removed by a hot $H_3PO_4$ solution. The insulating rods 56 are preferably BPSG and can be removed by a vapor HF solution, as mentioned above.

Figure 2J:
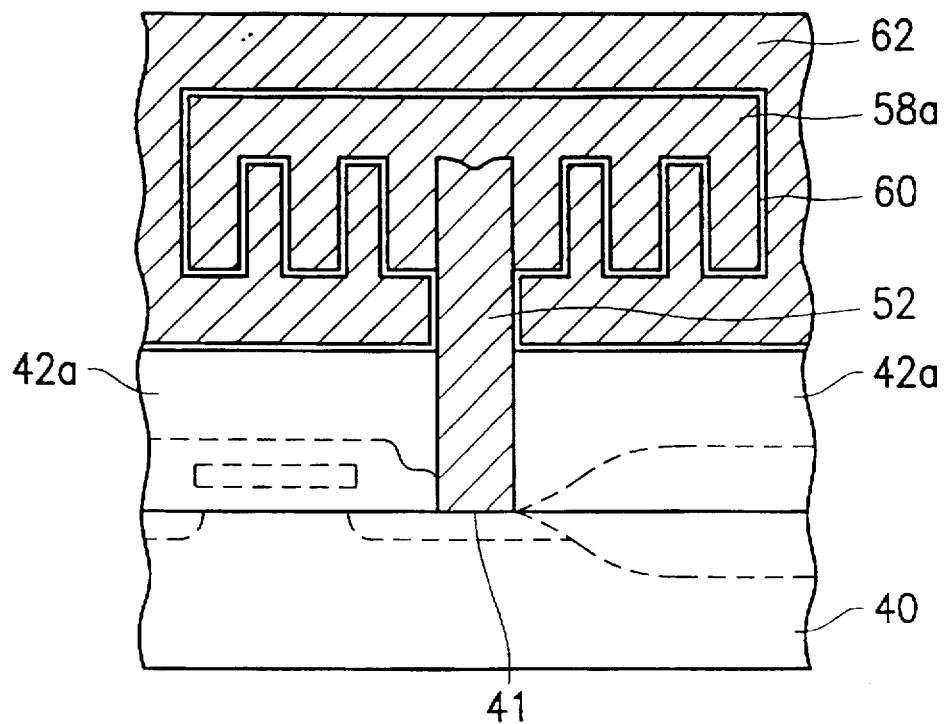

Referring to FIG. 2J, a second dielectric layer 60 and another electrode 62 are successively formed over the exposed surface of the rake-shaped electrode. The second dielectric layer 60 can be a thin ONO, $Ta_2O_5$, BST, PZT or other capacitor dielectric layer. The upper electrode 62 is a conducting polysilicon layer. The upper electrode 62 and the second dielectric layer 60 are then patterned to be defined within the capacitor area, thereby forming a complete stacked capacitor over the semiconductor substrate 40.

In the aforementioned preferred embodiment, the polysilicon rod 52 which supports the lower electrode is electrically connected to a diffusion region 41 in the semiconductor substrate 40. Therefore, a transistor including the diffusion region 41 is connected to the lower electrode of the capacitor, thereby forming a DRAM cell. Since the surface area of the lower electrode of the capacitor is enlarged due to its rake-shaped configuration, the performance of the DRAM cell is markedly improved, yet the configuration is compact so that it can be used in high density DRAM cells.

What is claimed is:

1. A method for fabricating a capacitor on a semiconductor substrate, comprising the steps of:

forming a TEOS layer over the semiconductor substrate;

forming a first dielectric layer over the TEOS layer;

forming an insulating layer over the first dielectric layer;

forming a window through the insulating layer, the first dielectric layer and the TEOS layer to expose a portion of the substrate;

providing a conducting polysilicon plug in the window which is in contact the semiconductor substrate;

forming an HSG-Si layer over the insulating layer thereby leaving exposed portions of the insulating layer;

removing the exposed portions of the insulating layer, thereby forming a polysilicon rod and a plurality of insulating rods over the first dielectric layer;

removing the HSG-Si layer;

forming a conducting polysilicon layer over the polysilicon rod and the plurality of insulating rods;

patterning a capacitor region which includes the polysilicon rod and a portion of the insulating rods;

removing the first dielectric layer and the remaining insulating rods, thereby forming a rake-shaped electrode which includes the polysilicon rod and the conducting polysilicon layer;

forming a second dielectric layer over the exposed surface of the rake-shaped electrode; and forming a second electrode over the second dielectric layer.

2. The method as claimed in claim 1, wherein the first dielectric layer is formed by depositing a silicon nitride layer.

3. The method as claimed in claim 1, wherein the insulating layer is a BPSG layer.

4. The method as claimed in claim 1, wherein the conducting polysilicon plug is formed by etching back a conducting polysilicon layer.

5. The method as claimed in claim 4, wherein the conducting polysilicon layer is formed by depositing a doped polysilicon layer.

6. The method as claimed in claim 4, wherein the conducting polysilicon layer is formed by depositing a polysilicon layer which is then doped with impurities.

7. The method as claimed in claim 1, wherein the HSG-Si layer is formed by low-pressure chemical-vapor deposition.

8. The method as claimed in claim 1, wherein the HSG-Si layer is formed by a seeding method.

9. The method as claimed in claim 1, wherein the second dielectric layer is an ONO layer.

10. The method as claimed in claim 1, wherein the second dielectric layer is a $Ta_2O_5$ layer.

11. The method as claimed in claim 1, wherein the second dielectric layer is a PZT layer.

12. The method as claimed in claim 1, wherein the second dielectric layer is a BST layer.

13. The method as claimed in claim 1, wherein the second electrode is a conducting polysilicon layer.

14. The method as claimed in claim 1 further comprising the step for patterning the second dielectric layer and the second electrode.

* * * * *